(12) United States Patent
Johnson et al.

(10) Patent No.: US 7,292,433 B2
(45) Date of Patent: Nov. 6, 2007

(54) ADJUSTMENT ASSEMBLY FOR BACK-TO-BACK ENCLOSURES, AND BACK-TO-BACK ENCLOSURE ASSEMBLY EMPLOYING THE SAME

(75) Inventors: Jeffrey L. Johnson, Lincoln, IL (US); Syed M. Karim, Lincoln, IL (US)

(73) Assignee: Eaton Corporation, Cleveland, OH (US)

( * ) Notice: Subject to any disclaimer, the term of this patent is extended or adjusted under 35 U.S.C. 154(b) by 211 days.

(21) Appl. No.: 11/263,436

(22) Filed: Oct. 31, 2005

(65) Prior Publication Data

US 2007/0109732 A1    May 17, 2007

(51) Int. Cl.
*H02B 1/01* (2006.01)
*H02B 1/00* (2006.01)
*F16B 12/00* (2006.01)

(52) U.S. Cl. .................. 361/627; 361/659; 312/111; 312/223.1

(58) Field of Classification Search ............... None
See application file for complete search history.

(56) References Cited

U.S. PATENT DOCUMENTS

| | | | | |
|---|---|---|---|---|
| 4,786,119 A | * | 11/1988 | Smuda | ............ 312/195 |
| 5,378,058 A | * | 1/1995 | Tessmer | ............ 312/298 |
| 5,587,874 A | * | 12/1996 | Hoppensteadt et al. | ...... 361/663 |
| 5,638,256 A | | 6/1997 | Leach et al. | |
| 6,421,229 B1 | | 7/2002 | Campbell et al. | |
| 6,561,605 B1 | * | 5/2003 | Akers | ............ 312/348.1 |
| 6,577,495 B2 | * | 6/2003 | West | ............ 361/626 |
| 6,700,060 B1 | | 3/2004 | Johnson | |
| 6,879,483 B2 | | 4/2005 | Johnson et al. | |
| 6,938,966 B1 | * | 9/2005 | Rouwhorst | ............ 312/111 |
| 7,005,590 B1 | * | 2/2006 | Willis | ............ 200/50.32 |
| 7,196,900 B2 | * | 3/2007 | Ewing et al. | ............ 361/642 |

* cited by examiner

*Primary Examiner*—Boris Chérvinsky
(74) *Attorney, Agent, or Firm*—Martin J Moran

(57) ABSTRACT

An adjustment assembly adjustably couples enclosures, such as a meter breaker panelboard and a load distribution panelboard, in a back-to-back configuration within a structure, such as a wall. The adjustment assembly includes a first end member at or about the top end of one of the enclosures, a second end member at or about the bottom end of the other enclosure, and at least one fastener coupling the end members together. A number of elongated apertures in at least one of the end members, such as slots and arcuate apertures, provide translational and pivotal adjustment, respectively. The fastener, which may comprise bolts and wingnuts to enable such adjustment without requiring separate tools, extends from one enclosure through at least one of the elongated apertures in the end member of the other enclosure in order to couple the enclosures together while enabling adjustment of one enclosure with respect to the other.

18 Claims, 4 Drawing Sheets

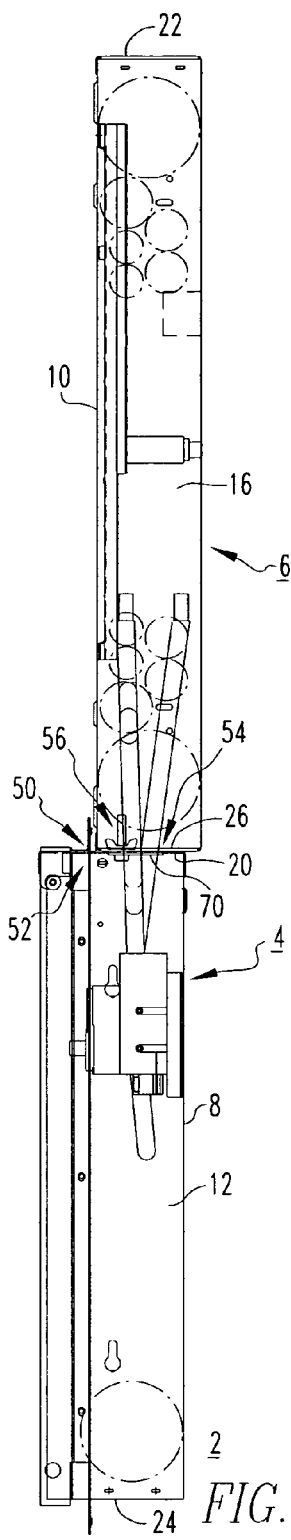
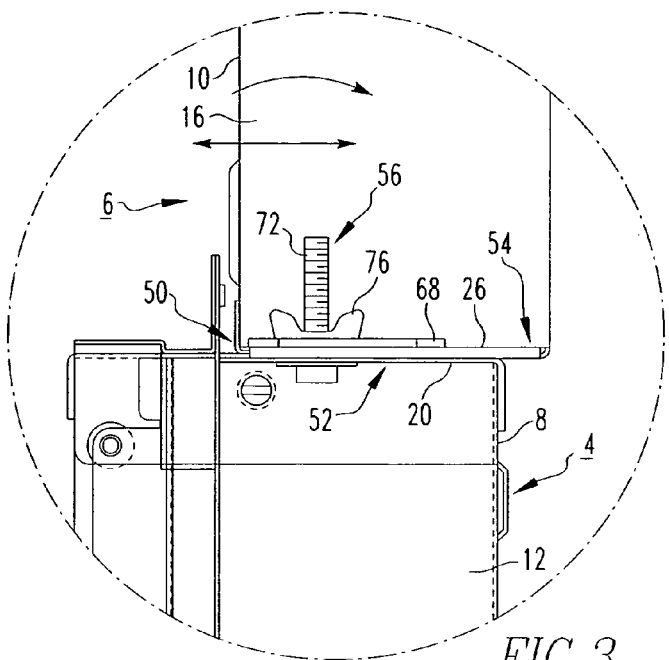
FIG.3
FIG.2
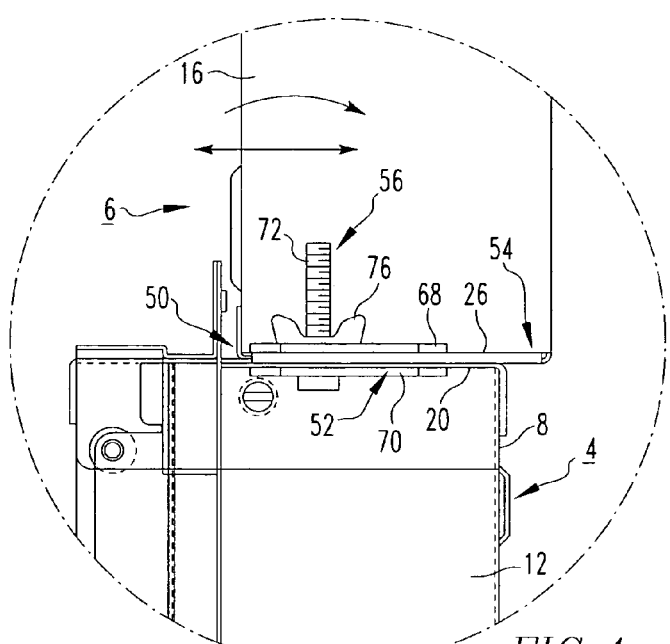
FIG.4

ADJUSTMENT ASSEMBLY FOR BACK-TO-BACK ENCLOSURES, AND BACK-TO-BACK ENCLOSURE ASSEMBLY EMPLOYING THE SAME

BACKGROUND OF THE INVENTION

1. Field of the Invention

The present invention relates generally to enclosures and, more particularly, to enclosures which are coupled together in a back-to-back configuration. The invention also relates to an adjustment assembly for back-to-back enclosure assemblies.

2. Background Information

Buildings, such as for example, commercial buildings and residences, typically have an electrical distribution center with one or more enclosures, such as for example, boxes or cabinets, which house electrical equipment (e.g., without limitation, relays; circuit breakers; meters; transformers). The enclosures protect the electrical equipment. For example, when mounted on the exterior of the building, the enclosure generally shields the enclosed electrical equipment from the environment and, in particular, damage caused by moisture. Whether disposed on the interior or the exterior of the building, the enclosure typically also includes a door or access panel, and thus serves the additional purpose of resisting undesired access to the electrical equipment housed within the enclosure.

In certain applications, two or more enclosures are employed in a back-to-back configuration. For example, one enclosure, such as a load distribution panelboard, is mounted on the interior of the building with its back facing the opposite direction of the back of another enclosure to which is coupled. The other enclosure may be, for example, a meter breaker panelboard which is accessible from the exterior of the building. In other words, the load distribution panelboard and the meter breaker panelboard are coupled together and mounted back-to-back on the same wall of the building. The load distribution panelboard is disposed on the inside surface of the wall and the meter breaker panelboard is disposed on the exterior of the wall. Accordingly, the two panelboards, which are normally separate devices, are joined together.

Known back-to-back enclosure designs suffer from a number of disadvantages, including the fact that the load distribution panelboard, which faces the interior of the building, is typically fixedly fastened to the meter breaker panelboard, thus making it stationary and rendering it substantially incapable of being adjusted. Accordingly, once the enclosures are installed, the load distribution panelboard, which is typically mounted in a semi-flush orientation, cannot be adjusted by the installer as necessary to, for example, accommodate various wallboard or other substrate thicknesses, and/or other deviations or irregularities. The fit and finish of the installation can, therefore, be compromised.

Accordingly, there is room for improvement in back-to-back electrical enclosure assemblies.

SUMMARY OF THE INVENTION

These needs and others are met by the present invention, which is directed to an adjustment assembly for enclosures, such as electrical panelboards, which are mounted in a back-to-back configuration.

As one aspect of the invention, an adjustment assembly is provided for joining a pair of enclosures each including a back panel, first and second side walls extending from the back panel, a top end, and a bottom end. The adjustment assembly comprises: a first end member structured to be coupled at or about the top end of one of the enclosures; a second end member structured to be coupled at or about the bottom end of the other of the enclosures; and at least one fastener structured to couple the first and second end members together, wherein at least one of the first and second end members includes a number of elongated apertures. The fastener extends from one of the enclosures through at least one of the elongated apertures in the end member coupled to the other of the enclosures in order to couple the enclosures together while enabling adjustment of the enclosures with respect to one another.

The first and second end members may comprise first and second brackets wherein at least one of the first and second brackets includes among the number of elongated apertures, a first elongated slot and a second elongated slot, and wherein the at least one fastener includes a first fastener and a second fastener. The first and second fasteners may each have a threaded first fastener component and a correspondingly threaded second fastener component. The threaded first fastener component may be received in the first and second elongated slots wherein the correspondingly threaded second fastener component is structured to be tightened and loosened upon the threaded first fastener component and, when the correspondingly threaded second fastener component is loosened, the first and second fasteners are movable with respect to the first and second elongated slots in order to provide the adjustment of the enclosures.

The adjustment assembly may further include at least one plate member disposed between the first fastener component and the second fastener component. The plate member may be selected from the group consisting of a washer and a cam member. The washer may include an elongated slot structured to receive and provide adjustable movement of the fastener component disposed therein, and may optionally further include a pair of protrusions structured to engage and maintain alignment with at least one of the elongated apertures of the end member. The cam member may include a lobe and an adjustment portion wherein, in response to the adjustment portion being adjusted, the lobe is structured to engage one of the first and second side walls of one of the enclosures in order to move the enclosure with respect to the other one of the enclosures.

The number of elongated apertures may include one or more apertures selected from the group consisting of arcuate apertures and slots wherein the arcuate apertures are structured to provide as the adjustment of the enclosures, pivotal adjustment, and the slots are structured to provide as the adjustment, translational adjustment of the enclosures.

The enclosures may comprise a first electrical enclosure and a second electrical enclosure wherein the adjustment assembly adjustably couples the first and second electrical enclosures in a back-to-back configuration in which the back panel of the first electrical enclosure generally faces in an opposite direction with respect to the back panel of the second electrical enclosure. The first and second electrical enclosures may be a meter breaker panelboard and a load distribution panelboard, respectively, wherein the first end member is a hood of the meter breaker panelboard and includes a pair of holes, and the second end member is a bottom end wall of the load distribution panelboard and includes as the number of elongated apertures, a pair of slots structured to be disposed generally opposite the pair of holes of the hood. The fastener may include first and second fastener members extending from the holes of the meter breaker panelboard, through the slots of the load distribution panelboard, and respectively receiving a third fastener member and a fourth fastener member structured to be tightened and loosened thereon, in order to provide the adjustment.

As another embodiment of the invention, an enclosure assembly comprises: first and second electrical enclosures each including a back panel, first and second side walls extending from the back panel, a top end, and a bottom end; and an adjustment assembly adjustably coupling the first and second electrical enclosures in a back-to-back configuration with respect to a structure, in order that the back panel of the first electrical enclosure generally faces in an opposite direction with respect to the back panel of the second electrical enclosure, the adjustment assembly comprising: a first end member coupled at or about the top end of the first electrical enclosure, a second end member coupled at or about the bottom end of the second electrical enclosure, and at least one fastener coupling the first and second end members together, wherein at least one of the first and second end members includes a number of elongated apertures, the at least one fastener extending from the first electrical enclosure through at least one of the elongated apertures in the second end member in order to enable adjustment of the electrical enclosures with respect to one another.

The structure may be a wall wherein the enclosure assembly comprises an electrical distribution system including as the first and second electrical enclosures, a meter breaker panelboard and a load distribution panelboard, and wherein the adjustment assembly adjustably couples the meter breaker panelboard and the load distribution panelboard in the back-to-back configuration within the wall. The wall may include a plurality of studs wherein the adjustment assembly provides the adjustment in order to align the load distribution panelboard with respect to the wall and, when the load distribution panelboard is aligned, the side walls of the load distribution panelboard are fastened to the studs in the wall.

BRIEF DESCRIPTION OF THE DRAWINGS

A full understanding of the invention can be gained from the following description of the preferred embodiments when read in conjunction with the accompanying drawings in which:

FIG. 2 is a side elevational view of the back-to-back adjustable enclosure assembly of FIG. 1;

FIG. 3 is a side elevational view of an adjustment assembly which employs one plate member in accordance with an embodiment of the invention;

FIG. 4 is a side elevational view of another adjustment assembly which employs two plate members in accordance with an embodiment of the invention;

DESCRIPTION OF THE PREFERRED EMBODIMENTS

Figure 1:
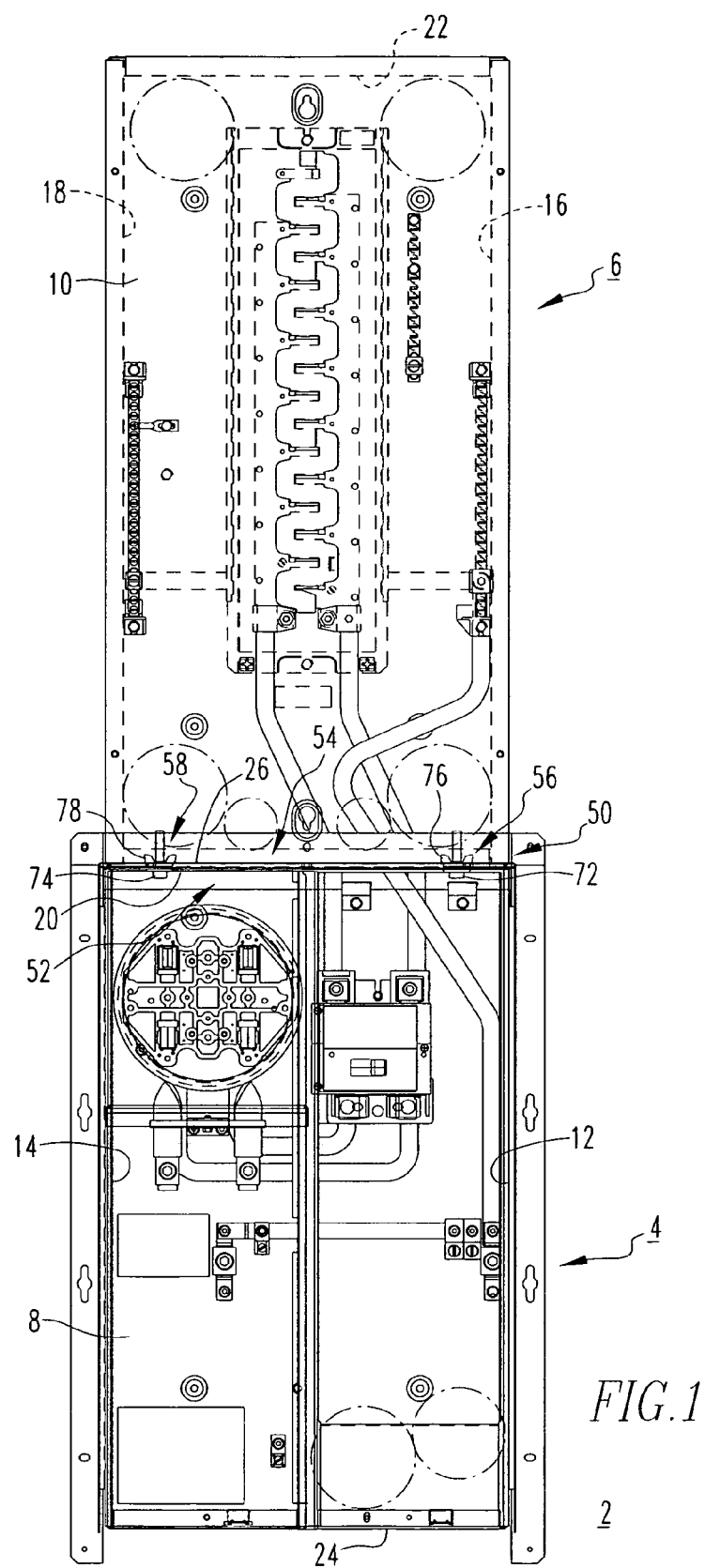
FIG. 1 is an elevational view of a semi-flush metered panelboard which is adjustably coupled to a load center or distribution panelboard in a back-to-back configuration in accordance with an embodiment of the invention, the front of the semi-flush metered panelboard and the back of the distribution panelboard are shown.

For purposes of illustration, the present invention will be described as applied to back-to-back electrical enclosures for enclosing electrical equipment (e.g., without limitation, relays; circuit breakers; electric meters; transformers), at least one of the enclosures being adapted for mounting within a structure, such as for example, the wall of a building. However, it will become apparent that it could also be applied to other types of enclosures adapted for both indoor and outdoor (i.e., weather-resistant) use and for back-to-back mounting locations other than within the wall of a building.

Directional phrases used herein, such as, for example, top, bottom, upper, lower and derivatives thereof, relate to the orientation of the elements shown in the drawings and are not limiting upon the claims unless expressly recited therein.

As employed herein, the term "fastener" refers to any suitable connecting or tightening mechanism expressly including, but not limited to, screws, bolts (e.g., without limitation, carriage bolts) and the combinations of bolts and nuts (e.g., without limitation, lock nuts and wing nuts) and bolts, washers and nuts.

As employed herein, the statement that two or more parts are "coupled" together shall mean that the parts are joined together either directly or joined through one or more intermediate parts.

As employed herein, the term "number" shall mean one or more than one (i.e., a plurality).

As employed herein, the term "adjustment" refers to movement of one component with respect to another component to which it is coupled and expressly includes, but is not limited to, pivoting and translation of the components with respect to one another. For example, the adjustment assembly of the invention enables at least one of the exemplary panelboards, which are coupled together in a back-to-back configuration, to be adjusted (e.g., without limitation, pivoted and/or translated) with respect to the other panelboard, in order to accommodate various mounting conditions and thus provide an optimized installation within, for example and without limitation, the wall of a residence or other structure.

As employed herein, the term "residence" shall expressly include, but is not limited to, a home, apartment, dwelling, office and/or place where a person or persons reside(s) and/or work(s).

As employed herein, the term "structure" shall expressly include, but is not limited to, a home, apartment, dwelling, garage, office building, commercial building, industrial building, roofed and/or walled structure built for permanent or temporary use, structure for a land vehicle, structure for a marine vehicle, structure for an air vehicle, or structure for another motor vehicle.

As employed herein, the term "land vehicle" shall expressly include, but is not limited to, any land-based vehicles having pneumatic tires, any rail-based vehicles, any maglev vehicles, automobiles, cars, trucks, station wagons, sport-utility vehicles (SUVs), recreational vehicles, all-terrain vehicles, vans, buses, motorcycles, mopeds, campers, trailers, or bicycles.

As employed herein, the term "marine vehicle" shall expressly include, but is not limited to, any water-based vehicles, ships, boats, other vessels for travel on water, submarines, or other vessels for travel under water.

As employed herein, the term "air vehicle" shall expressly include, but is not limited to, any air-based vehicles, airplanes, jets, aircraft, airships, balloons, blimps, or dirigibles.

Figure 6:
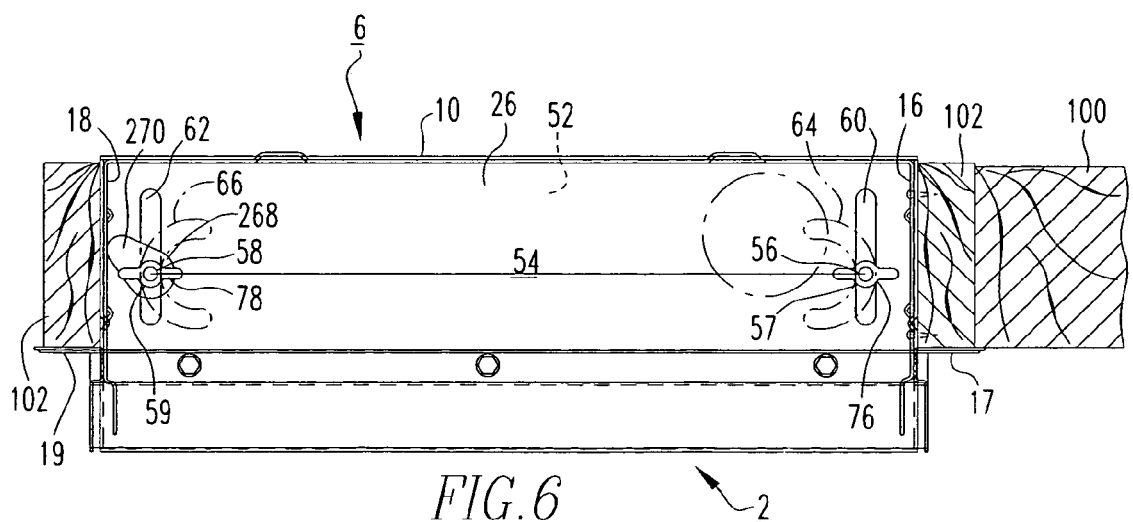
FIG. 6 is a top plan view of an adjustment assembly employing specifically shaped slots in accordance with another embodiment of the invention.

FIG. 1 shows an enclosure assembly 2 employing an adjustment assembly 50 in accordance with the invention. The enclosure assembly 2 generally includes first and second electrical enclosures 4, 6 each including a back panel 8, 10, first and second side walls 12, 14, 16, 18 extending from the back panel 8, 10, a top end 20, 22, and a bottom end 24, 26, respectively. In the example shown and described herein, the first and second electrical enclosures 4, 6 are a meter breaker panelboard 4 and a load distribution panelboard 6, both of which are coupled in a back-to-back configuration within a structure, such as for example, without limitation, a wall 100 (FIG. 6). As previously discussed, such back-to-back installations are common, for example, in the basement or garage area of a residence, and in a variety of commercial buildings and other structures.

Referring to FIG. 1, and also to FIG. 2, it will be understood that the enclosure assembly 2 is back-to-back in that the back panel 8 of meter breaker panelboard 4 faces an opposite direction in comparison to back panel 10 of load distribution panelboard 6. In accordance with the invention, the adjustment assembly 50 adjustably couples the meter breaker panelboard 4 and electrical distribution panelboard 6 in such back-to-back configuration (best shown in FIG. 2).

As shown in FIGS. 1-4, the adjustment assembly 50 includes a first end member 52 coupled at or about the top end 20 of the meter breaker panelboard 4, a second end member 54 coupled at or about the bottom end 26 of the load distribution panelboard 6, and at least one fastener 56, 58 for coupling the first and second end members 52, 54 together. In the examples of FIGS. 1-4, the first and second end members 52, 54 comprise the hood 52 of meter breaker panelboard 4 and the bottom end wall 54 of load distribution panelboard 6, respectively. At least one of the hood 52 and bottom end wall 54 include a number of elongated apertures 60, 62, 64, 66 (FIG. 6). The fasteners 56, 58 extend from the hood 52 of the meter breaker panelboard 4 through the elongated apertures 60, 62, 64, 66 in the bottom end wall 54 of the load distribution panelboard 6, as best shown in FIG. 6. In this manner, the adjustment assembly 50 enables adjustment of the meter breaker panelboard 4 and load distribution panelboard 6 with respect to one another, in order to provide an optimized installation within, for example, wall 100 (FIG. 6), or any other suitable structure.

It will be appreciated that, while two fasteners 56, 58 are shown in the examples discussed herein (see, e.g., FIGS. 1, 6 and 7), any other suitable number (e.g., one, or three or more) fasteners in any suitable configuration could be employed. Additionally, the exemplary fasteners 56, 58, as shown for example in FIG. 1, comprise first, second, third and fourth fastener components or members 72, 74, 76, 78 wherein the first and second fastener members 72, 74 are threaded fasteners such as, for example, bolts which protrude from hood 52, and the third and fourth fastener members 76, 78 are correspondingly threaded nuts, such as, for example, wing nuts 76, 78. The wing nuts 76, 78 are quickly and easily tightened and loosened on the bolts 72, 74 in order to secure and adjust, respectively, the panelboards 4, 6 with respect to one another, without requiring the use of separate tools. More specifically, when the wing nuts 76, 78 are loosened, the first and second fasteners 56, 58 are moveable within the elongated slots 60, 62, 64, 66 (FIG. 6). Once the desired position or alignment of the panelboards 4, 6 is achieved, the wing nuts 76, 78 are tightened in order to securely couple the panelboards together while maintaining the desired position.

Referring briefly to FIG. 6, it will be appreciated that the elongated slots 60, 62, 64, 66 include slots 60, 62 which provide translational adjustment, and optionally further include arcuate apertures 64, 66 (shown in phantom line drawing) in order to provide pivotal or rotational adjustment when wing nuts 76, 78 of first and second fasteners 56, 58, are loosened. It will be appreciated, however, that any known or suitable alternative elongated aperture configuration (not shown) could be employed. For example, in certain embodiments of the invention, only one aperture, such as a generally centrally disposed aperture on bottom end wall 26 between side walls 16 and 18 of load distribution panelboard 6, in combination with a single fastener.

In the examples of FIGS. 2-4, 5A, 5B and 6, the adjustment assembly 50 further includes at least one plate member 68, 70, 168, 268 disposed between the first fastener component (e.g., bolt 72) and second fastener component (e.g., wing nut 76). In the examples of FIGS. 2-4, the plate member comprises a washer 68 (FIGS. 3 and 4), 70 (FIGS. 2 and 4). Specifically, in the example of FIG. 2, a single washer 70 is disposed inside hood 52 of meter breaker panelboard 4 and abuts the top end 20, thereof. In the example of FIG. 3, a single washer 68 is again employed, but on the inside of load distribution panelboard 6 and abutting the bottom end wall 54 thereof. In FIG. 4, both washers 68 and 70 are employed, as shown. It will be appreciated, however, that other numbers and configurations of plate members (e.g., without limitation, washers) could be employed, or alternatively no plate members need to be employed.

Figure 5A:
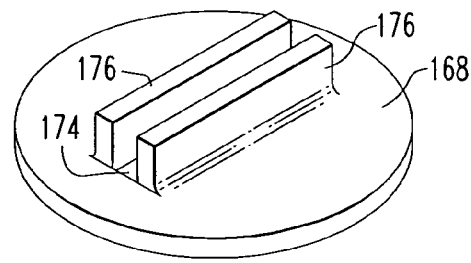
FIG. 5A is an isometric view of a washer-type plate member in accordance with an embodiment of the invention.
Figure 5B:
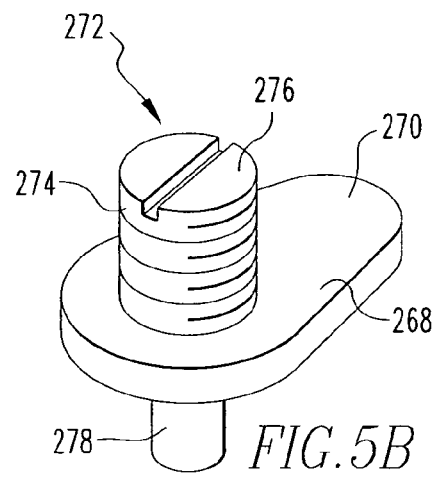
FIG. 5B is an isometric view of a cam-type plate member in accordance with another embodiment of the invention.

For example, without limitation, two alternative plate members 168, 268 are shown in FIGS. 5A and 5B. In FIG. 5A, the plate member comprises a washer 168 which includes an elongated slot 174 and a pair of protrusions 176 protruding upward from the substantially flat plane of the washer 168. The elongated slot 174 permits the aforementioned fasteners to slide with respect thereto, while the pair of protrusions 176 are designed to fit within one of the slots 60, 62 (FIG. 6). It will be appreciated, however, that any combination of an elongated slot 174, one or more protrusions 176, and a combination of elongated slots 174 and protrusions 176, could be employed.

In the example of FIG. 5B, the plate member is a cam member 268 having a lobe 270 and an adjustment portion 272. The adjustment portion includes a threaded fastener member 274 which is engageable by a nut such as the wing nut previously discussed, and further includes a head 276 which may be adjusted in order to pivot the cam 268 so that lobe 270 engages, for example, side wall 18, as shown in FIG. 6, and moves one of the panelboards (e.g., load distribution panelboard 6) with respect to the other. Specifically, the cam 268 may be engageable, for example, by a screwdriver (not shown) or other suitable tool (not shown) in order to effectuate such adjustment. Once adjusted, the wing nut 78 may be tightened on threaded fastener member 274, as shown in FIG. 6. The cam 268 may optionally include a second protrusion 278, as shown in FIG. 5B. The second protrusion would function to engage, for example, slot 62 in order to provide a pivot point about which cam 268 may rotate in order to provide the aforementioned adjustment of the panelboard 6. It will be appreciated, however, that any combination of plate members 68, 70, 168, 268, could be employed without departing from the scope of the invention.

As shown in FIG. 6, the fasteners 56, 58 extend from holes 57, 59 in hood 52 through the slots 60, 62. Once the enclosure assembly 2 is adjusted and positioned, as desired, the wing nuts 76, 78 are tightened as previously discussed, in order to initially secure the assembly 2 in a desired position. Subsequently, at least one of the panelboards (e.g., load distribution panelboard 6) is further secured, in the desired position, within the wall 100. Specifically, the side walls 16, 18 and/or flanges 17, 19 extending therefrom, are nailed, screwed, stapled, or otherwise suitably secured to one or more studs 102 within the wall 100, as shown. In this manner, an optimized, secure installation within the wall 100 may be achieved.

Figure 7:
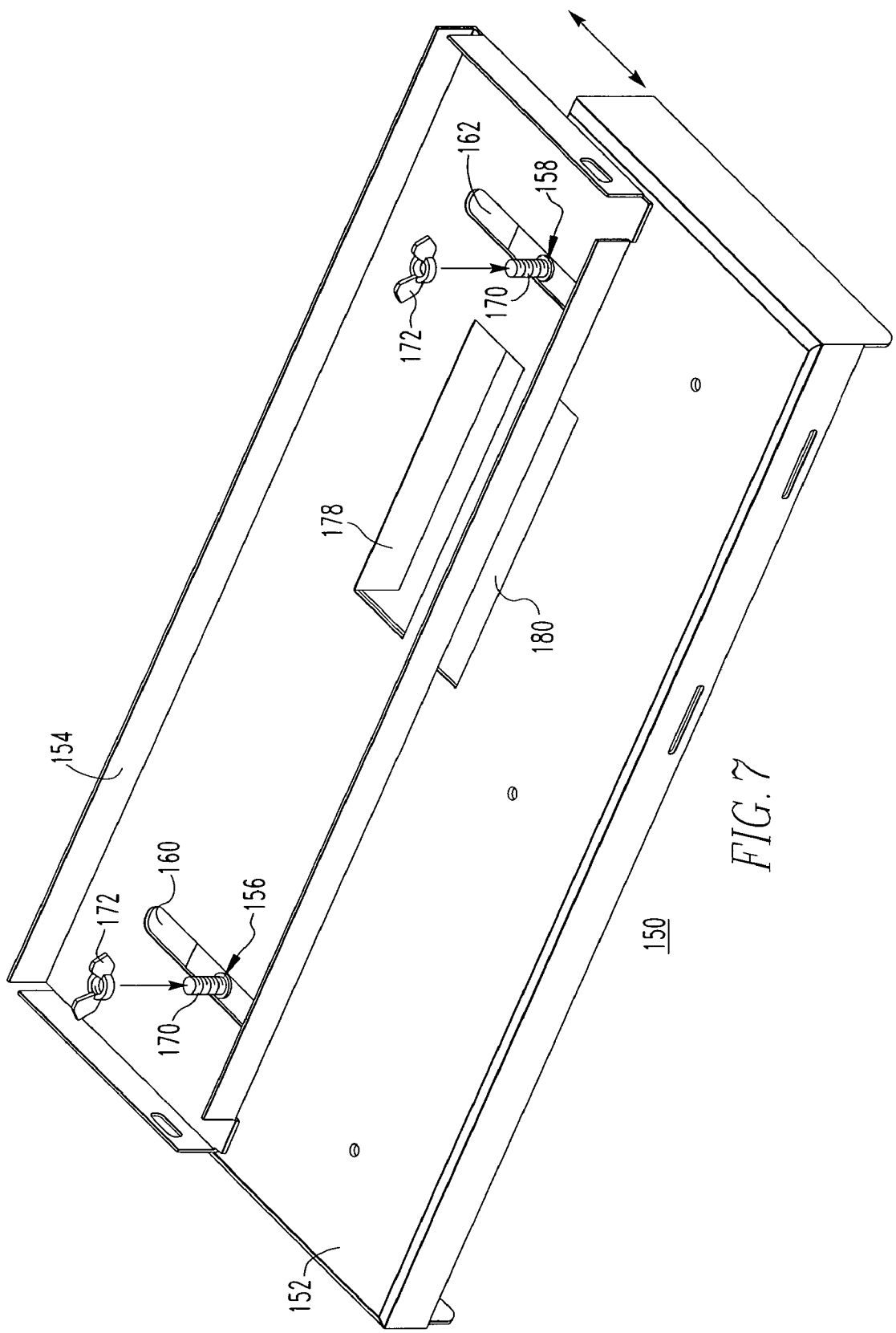
FIG. 7 is an isometric view of an adjustment assembly employing a pair of interlocking brackets in accordance with an embodiment of the invention.

FIG. 7 shows another example adjustment assembly 150, in accordance with the invention. Here, the aforementioned first and second end members 52, 54 of the meter breaker panelboard 4 and load distribution panelboard 6 comprise first and second brackets 152, 154, respectively. The first bracket 152 is employed in place of hood 52 (FIGS. 1-4) of the meter breaker panelboard 4 (FIGS. 1-4), while second bracket 154 replaces the aforementioned lower end wall 54 (FIGS. 1-4) of load distribution panelboard 6 (FIGS. 1-4). The first and second threaded fasteners, such as, for example, the extruded studs 156, 158, shown, extend from first bracket 152 through corresponding elongated slots 160, 162 in second bracket 154. The exemplary studs 156, 158 are threaded to comprise a first fastener component 170 structured to receive a correspondingly threaded second fastener component, such as, for example, the wing nuts 172 shown.

In operation, the adjustment assembly 150 functions substantially similarly to the embodiment previously discussed herein in connection with FIGS. 1-4. Specifically, the wing nuts 172 may be loosened and tightened upon the threaded studs 156, 158 in order to enable movement of the first and second brackets 152, 154 and thus the panelboards (not shown) coupled thereto, with respect to one another. As shown in the example of FIG. 7, the second bracket 154 optionally includes a tab 178 which protrudes generally vertically from the bracket, as shown, and is structured to be received within a corresponding recess 180 in first bracket 152. This tab 178, recess 180 configuration functions to further maintain engagement and alignment between the first and second brackets 152, 154 and the panelboards (not shown) in FIG. 7 coupled thereto, as shown.

Accordingly, the adjustment assembly of the invention enables adjustment (e.g., without limitation, pivoting and translation) of at least one of the enclosures (e.g., without limitation, load distribution panelboard 6) with respect to another enclosure (e.g., without limitation, meter breaker panelboard 4), thereby accommodating various mounting conditions and providing an optimized installation.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:

1. An adjustment assembly for joining a pair of enclosures each including a back panel, first and second side walls extending from said back panel, a top end, and a bottom end, said adjustment assembly comprising:

a first end member structured to be coupled at or about the top end of one of said enclosures;

a second end member structured to be coupled at or about the bottom end of the other of said enclosures; and at least one fastener structured to couple said first and second end members together, wherein at least one of said first and second end members includes a number of elongated apertures, said at least one fastener extending from one of said enclosures through at least one of said elongated apertures in said at least one of said first and second end members coupled to the other of said enclosures in order to couple said enclosures together while enabling adjustment of said enclosures with respect to one another; wherein said first and second end members comprise first and second brackets; wherein at least one of said first and second brackets includes among said number of elongated apertures, a first elongated slot and a second elongated slot; wherein said at least one fastener includes a first fastener and a second fastener, said first and second fasteners each having a threaded first fastener component and a correspondingly threaded second fastener component; said threaded first fastener component being received in said first and second elongated slots; wherein said correspondingly threaded second fastener components is structured to be tightened and loosened upon said threaded first fastener component; and wherein, when said correspondingly threaded second fastener component is loosened, said first and second fasteners are movable with respect to said first and second elongated slots in order to provide said adjustment of said enclosures.

2. The adjustment assembly of claim 1 wherein said threaded first fastener component comprises a bolt; and wherein said correspondingly threaded second fastener component comprises a nut.

3. The adjustment assembly of claim 1 wherein said number of elongated apertures includes apertures selected from the group consisting of arcuate apertures and slots; wherein said arcuate apertures are structured to provide as said adjustment of said enclosures, pivotal adjustment; and wherein said slots are structured to provide as said adjustment of said enclosures, translational adjustment.

4. The adjustment assembly of claim 1 wherein said at least one fastener includes a first fastener component and a second fastener component; and wherein said adjustment assembly further includes at least one plate member disposed between said first fastener component and said second fastener component.

5. The adjustment assembly of claim 4 wherein said at least one plate member is selected from the group consisting of a washer and a cam member.

6. The adjustment assembly of claim 5 wherein said washer includes an elongated slot structured to receive and provide adjustable movement of said at least one fastener disposed therein, and a pair of protrusions structured to engage and maintain alignment with at least one of said elongated apertures of said at least one of said first and second end members.

7. The adjustment assembly of claim 5 wherein said cam member includes a lobe and an adjustment portion; and wherein, in response to said adjustment portion being adjusted, said lobe is structured to engage one of said first and second side walls of one of said enclosures in order to move said one of said enclosures with respect to the other of said enclosures.

8. The adjustment assembly of claim 1 wherein said enclosures comprise a first electrical enclosure and a second electrical enclosure; and wherein said adjustment assembly adjustably couples said first and second electrical enclosures in a back-to-back configuration in which said back panel of said first electrical enclosure generally faces in an opposite direction with respect to said back panel of said second electrical enclosure.

9. The adjustment assembly of claim 8 wherein said first and second electrical enclosures are a meter breaker panelboard and a load distribution panelboard, respectively; wherein said first end member is a hood of said meter breaker panelboard and includes a pair of holes; wherein said second end member is a bottom end wall of said load distribution panelboard and includes as said number of elongated apertures, a pair of slots structured to be disposed generally opposite said pair of holes of said hood; and wherein said at least one fastener includes first and second fastener members extending from said holes of said meter breaker panelboard, through said slots of said load distribution panelboard, and respectively receiving a third fastener member and a fourth fastener member structured to be tightened and loosened thereon, in order to provide said adjustment.

10. An enclosure assembly comprising:
first and second electrical enclosures each including a back panel, first and second side walls extending from said back panel, a top end, and a bottom end; and
an adjustment assembly adjustably coupling said first and second electrical enclosures in a back-to-back configuration with respect to a structure, in order that said back panel of said first electrical enclosure generally faces in an opposite direction with respect to said back panel of said second electrical enclosure, said adjustment assembly comprising:
a first end member coupled at or about the top end of said first electrical enclosure,
a second end member coupled at or about the bottom end of said second electrical enclosure, and
at least one fastener coupling said first and second end members together, wherein at least one of said first and second end members includes a number of elongated apertures, said at least one fastener extending from said first electrical enclosure through at least one of said elongated apertures in said second end member in order to enable adjustment of said electrical enclosures with respect to one another.

11. The enclosure assembly of claim 10 wherein said threaded first fastener component comprises a bolt; and wherein said correspondingly threaded second fastener component comprises a nut.

12. The enclosure assembly of claim 10 wherein said elongated apertures includes apertures selected from the group consisting of arcuate apertures and slots; wherein said arcuate apertures provide as said adjustment of said first and second electrical enclosures, pivotal adjustment; and wherein said slots provide as said adjustment, translational adjustment.

13. The enclosure assembly of claim 10 wherein said at least one fastener includes a first fastener component and a second fastener component; and wherein said adjustment assembly further comprises at least one plate member disposed between said first fastener component and said second fastener component.

14. The enclosure assembly of claim 13 wherein said at least one plate member is selected from the group consisting of a washer and a cam member.

15. The enclosure assembly of claim 14 wherein said washer includes an elongated slot receiving and providing adjustable movement of said first fastener component disposed therein, and a pair of protrusions engaging at least one of said elongated apertures of said at least one of said first and second end members.

16. The enclosure assembly of claim 14 wherein said cam member includes a lobe and an adjustment portion; and wherein, in response to said adjustment portion being engaged and adjusted, said lobe engages one of said first and second side walls of one of said first and second electrical enclosures in order to move said first electrical enclosure with respect to said second electrical enclosure, thereby providing said adjustment.

17. The enclosure assembly of claim 10 wherein said structure is a wall; wherein said enclosure assembly comprises an electrical distribution system including as said first and second electrical enclosures, a meter breaker panelboard and a load distribution panelboard; and wherein said adjustment assembly adjustably couples said meter breaker panelboard and said load distribution panelboard in said back-to-back configuration within said wall.

18. The enclosure assembly of claim 17 wherein said wall includes a plurality of studs; wherein said adjustment assembly provides said adjustment in order to align said load distribution panelboard with respect to said wall; and wherein when said load distribution panelboard is aligned, said side walls of said load distribution panelboard are fastened to said studs in said wall.

* * * * *